United States Patent [19]
Storino et al.

[11] Patent Number: 6,111,422
[45] Date of Patent: Aug. 29, 2000

[54] METHOD OF TESTING SUSCEPTIBILITY TO FAILURE OF FUNCTIONAL CIRCUITRY EMBODIED IN AN INTEGRATED CIRCUIT

[75] Inventors: Salvatore Nickolas Storino; Robert Russell Williams, both of Rochester, Minn.

[73] Assignee: International Business Machines Corporation, Armonk, N.Y.

[21] Appl. No.: 09/303,793

[22] Filed: Apr. 30, 1999

Related U.S. Application Data

[62] Division of application No. 08/568,743, Dec. 7, 1995, Pat. No. 6,005,406.

[51] Int. Cl.[7] ................................................. G01R 31/02
[52] U.S. Cl. ............................................ 324/763; 324/765
[58] Field of Search ................................. 324/73.1, 158.1, 324/765, 763; 438/14, 17, 18; 257/40, 48; 714/733, 727, 734

[56] References Cited

U.S. PATENT DOCUMENTS

| | | |
|---|---|---|
| 4,243,937 | 1/1981 | Multani et al. . |
| 4,323,842 | 4/1982 | McGarrity et al. . |
| 4,336,495 | 6/1982 | Hapke . |
| 4,481,628 | 11/1984 | Pasquinelli . |
| 4,516,071 | 5/1985 | Buehler . |
| 4,550,289 | 10/1985 | Kabashima et al. . |
| 4,743,841 | 5/1988 | Takeuchi . |
| 4,782,288 | 11/1988 | Vento . |
| 4,866,508 | 9/1989 | Eichelberger et al. ............. 324/158.1 |
| 4,891,577 | 1/1990 | Ishikawa . |
| 4,947,105 | 8/1990 | Unger et al. . |
| 4,970,454 | 11/1990 | Stambaugh et al. . |
| 5,068,547 | 11/1991 | Gascoyne ............................ 324/73.1 |
| 5,179,345 | 1/1993 | Jenkins et al. . |
| 5,432,464 | 7/1995 | Darnault ................................ 326/37 |
| 5,521,524 | 5/1996 | Houston . |

*Primary Examiner*—Vinh P. Nguyen
*Attorney, Agent, or Firm*—David W. Lynch; Merchant & Gould; Mark A. Hollingsworth

[57] ABSTRACT

A test device is formed on a chip which allows the susceptibility to failure of functional circuitry formed on the chip to be tested. The test device allows aggressive design of chips which include sensitive circuitry, such as precharged dynamic logic, by testing whether deviations from the design specification introduced during manufacturing of the chip are sufficient to cause failure of the functional circuitry.

20 Claims, 3 Drawing Sheets

METHOD OF TESTING SUSCEPTIBILITY TO FAILURE OF FUNCTIONAL CIRCUITRY EMBODIED IN AN INTEGRATED CIRCUIT

This application is a Divisional of application Ser. No. 08/568,743, filed Dec. 7, 1995, which application is incorporated herein by reference, now U.S. Pat. No. 6,005,406.

BACKGROUND OF THE INVENTION

The present invention is directed to a test device and method, and more particularly to a test device and method for testing the susceptibility to failure of a functional circuit implemented in a semiconductor chip.

Over the past several years semiconductor chips have become the basis of nearly all modern electronic devices. For example, modern computers employ various processing chips to implement their function. Such computer chips are increasingly employing larger numbers of basic components, such as transistors, in order to improve both performance and processing capability of the computer chip. In order to increase the number of components used, it is necessary to increase the integration of the devices on the chip. Higher integration can be achieved by reducing the number of components needed to implement a desired function and by packing the individual components closer together. As more individual components are placed on a single chip the overall production cost is reduced.

Various approaches have been used to implement different functionality on a chip. For example, precharged dynamic logic circuits have been increasingly employed to implement logic functionality in modern computer chips. Dynamic logic is desirable because of its small size and fast performance. One drawback associated with using dynamic logic circuits is that such circuits tend to be quite sensitive to noise and other influences arising on the chip. External influences, such as noise and crosstalk introduced from other circuitry on the chip located in the vicinity of the dynamic logic circuit, must be carefully considered in designing chips using dynamic logic circuits.

The problems associated with the external influences on the operation of the dynamic logic circuitry becomes even more significant when the density of the components used to form the circuitry is increased. For example, where a number of dynamic logic circuits are grouped together in the same horizontal plane of the chip, the adjacent circuits may have a significant influence on each other. One notable problem involves signal wiring of such circuitry. If relatively long coupling lengths are used in the wiring layer, significant portions of the wiring may lie adjacent to wiring associated with one or more other circuits. A charge associated with a signal on an adjacent line may be capacitively coupled to the wiring of an adjacent dynamic circuit. The amount of voltage capacitively coupled onto a given line depends on the spacing between the adjacent wiring and on the coupling length because longer coupling lengths tend to increase the amount of adjacent wiring. As the spacing between the adjacent wiring decreases the amount of capacitively coupled voltage increases. A large enough voltage capacitively coupled to a wiring line of a dynamic circuit will cause undesirable switching in the dynamic circuit causing the chip to fail.

In order to prevent external influences, such as capacitively coupled voltages, from adversely affecting the operation of horizontally adjacent dynamic circuits, design specifications must be made in consideration of the potential external influences. For example, the dynamic circuits may be designed using components which are more noise resistant. One such approach is to provide a large, noise resistant pull-up transistor in a half latch of the dynamic logic circuit to maintain a desired voltage on a precharge node of the dynamic logic circuit despite the presence of capacitively coupled voltages which cause leakage through a control transistor. This approach, however, reduces the performance of the circuit because the large pull-up transistor also resists desired switching operations making it more difficult to switch the dynamic logic circuit during normal operation.

Another technique employed to avoid failure as a result of influences on the chip from devices external to the dynamic logic circuitry is to prescribe conservative horizontal wiring rules to ensure that crosstalk, for example, does not exceed acceptable levels for the components used in the dynamic circuitry. Such rules include prescribing an acceptable pitch or spacing between adjacent lines and an acceptable coupled length for the design.

A problem with such an approach is that conservative guidelines must account for potential deviations, from the ideal design parameters, which occur during the actual manufacturing process of the device. For example, for a given design using selected components it may be necessary to avoid a spacing between two 1.0 micron wide lines of less than 1.0 micron. This constraint may be necessary to avoid excessive capacitive coupling between the two lines. If manufacturing process limitations indicated that the actual line width can vary as much as 0.25 microns, then a designer must prescribe a spacing between the wiring lines of 1.5 microns to ensure that the required 1.0 micron spacing is present in circuits exhibiting the worst case process deviations, that is, two adjacent wiring lines each formed 1.25 microns wide. While such large process deviations may occur in only a very small percentage of the produced chips, the conservative design is required to ensure that none of the chips fail. As can be appreciated, such conservative design specifications significantly increase the overall size of the chip.

As the above example illustrates, when the process limitations are taken into account extremely conservative guidelines must be imposed in the manufacturing process to prevent shipment of bad chips. This problem becomes even more pronounced when the worst case scenario is concurrently extended to include the maximum potential deviations for each variable and component in the design.

The above approach severely hampers the design of chips using larger numbers of small, fast devices. Accordingly, there exists a need to provide a mechanism allowing aggressive design using, for example, precharged dynamic logic circuitry, while ensuring any failure arising as a result of process limitations can be detected in chips manufactured using the aggressive design.

SUMMARY OF THE INVENTION

Generally, the present invention provides a test circuit which allows aggressive design of semiconductor chips. In accordance with an embodiment of the invention there is provided a semiconductor device formed on a chip, which includes a functional circuit for performing a first function formed on the chip and designed to conform with design specifications and a test circuit which is designed to have minimal acceptable design characteristics in accordance with the design specifications. The test circuit includes a first portion having a general function corresponding to the first function of the functional circuitry and a second portion used to introduce influences on the first portion representative of influences expected to be encountered by the functional circuit in view of the design specifications.

In one embodiment the test device tests the susceptibility of functional circuitry on the chip having a precharge node to failure. The test device includes a first transistor coupled between a voltage source and a test precharge node to maintain a precharged voltage level on the test precharge node. The first transistor exhibits a minimum acceptable design characteristic in view of design specifications for the chip. The test device further includes a second transistor coupled between the test precharge node and ground and having a gate coupled to a test signal to test the susceptibility of the chip to failure.

The above summary of the present invention is not intended to present each embodiment or every aspect of the present invention. Rather, the invention will be understood by reference to the figures and the associated description which follow.

BRIEF DESCRIPTION OF THE DRAWINGS

The invention may be more completely understood in consideration of the following detailed description of various embodiments of the invention in connection with the accompanying drawings, in which.

Figure 1:
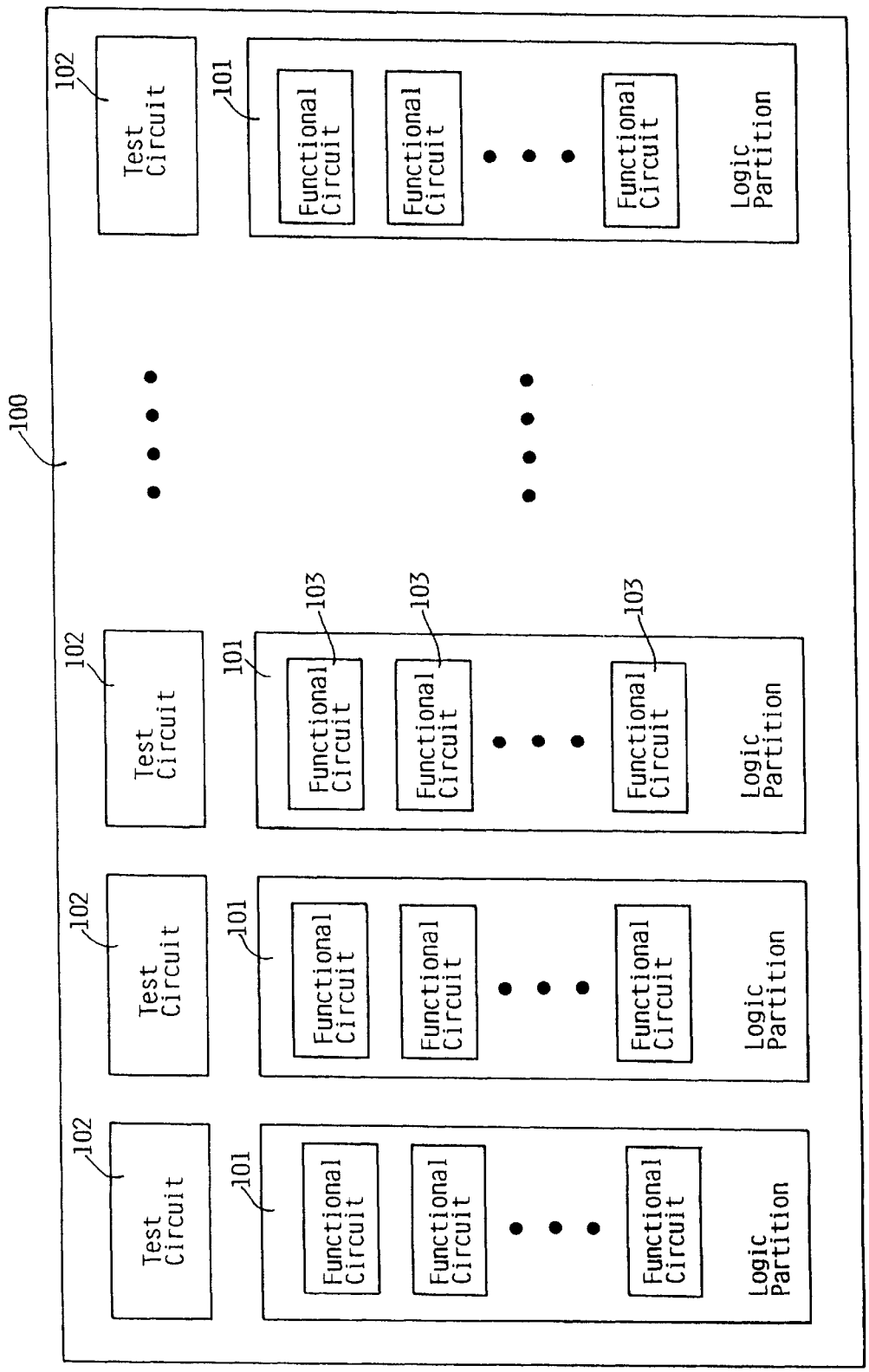
FIG. 1 illustrates in block form a chip in accordance with an embodiment of the present invention.

While the invention is amenable to various modifications and alterative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

In accordance with an exemplary embodiment of the invention, a chip may be designed using aggressive design specifications by incorporating a test device into the chip which provides an indication of the chip's susceptibility to failure resulting from manufacturing process induced deviations from design specifications. The exemplary embodiments described below use dynamic logic circuitry for purposes of illustration. It should be recognized, however, that the principles described could be used in connection with other types of circuitry which would benefit from the described advantages.

In an exemplary embodiment of the present invention, a test circuit may be formed on a chip which allows the chip's susceptibility to noise and crosstalk to be quantified and tested. Furthermore, such a test circuit can be used to ensure that final products which fail as a result of an aggressive design point and manufacturing deviations can be identified and rejected. As will be more fully appreciated from the following description of various embodiments, a single test circuit may be formed to test the overall chip, or individual test circuits may be associated with each individual logic partition or macro on the chip.

FIG. 1 illustrates, in block diagram form, an exemplary embodiment the present invention. In FIG. 1, a chip 100 includes a number of functional circuits 103 partitioned into a number of logic partitions 101. The functional circuits may include, for example, precharged dynamic logic circuitry. In the embodiment of FIG. 1, a number of individual test circuits 102 are provided in correspondence with each of the logic partitions 101. By providing a separate test circuit 102 for each logic partition 101, the test circuit 102 may be particularly adapted to test the susceptibility of a particular design specification used for its associated logic partition. Alternatively, one test circuit 102 could be employed for the entire chip 100 to test the susceptibility of the chip to failure based on the most aggressive design on the chip. Since the test circuit 102 is formed on the chip 100 during the processing steps used to the form the functional circuits 103 of the logic partitions 101, deviations from a design specification arising during the manufacturing process will also be present in characteristics of the test circuits 102.

As described more fully below, the individual test circuits 102 may be designed to include a circuit having functionality which corresponds to at least one function of the functional circuits. For example, where dynamic logic circuitry is employed in the functional circuits, a corresponding dynamic test circuit may be incorporated into the test circuit 102. The dynamic test circuit portion of the test circuit 102 is designed to exhibit minimal acceptable design characteristics in view of a design specification for the functional circuitry 103 of an associated logic partition 101. In other words, as more fully illustrated below, if the design specification prescribes a minimum device size for specified components and maximum allowable coupled lengths, the dynamic test circuit portion will be formed with components having the minimum device size. The test circuit 102 will also include circuitry for simulating noise introduced onto a control line of the dynamic test circuit portion, for example, representative of influences experienced by a functional dynamic circuit employing the maximum allowed coupled lengths. In this manner, the dynamic test circuit is designed to be the most sensitive device on the chip to noise and other influences.

By way of example, a test circuit 102 may be associated with a functional circuit 103 which uses precharged dynamic logic circuitry. In operation the test circuit 102 tests the operation of a dynamic test circuit portion under simulation of influences representative of external influences which would be experienced by the dynamic logic circuitry formed in the functional circuit 103. The external influences may include, for example, noise introduced from the operation of other devices on the chip. Thus, the noise is external in the sense that it does not arise from the intended operation of the specific circuitry of which the susceptibility to influences is to be tested. If the voltage level at a precharged node of the dynamic test circuit changes in response to the simulated influences sufficient to change the output of the dynamic test circuit, it can be determined that precharged dynamic logic circuitry on the chip will likely fail. Accordingly, the chip will be rejected at the test phase. As can be appreciated, by incorporating such a test circuit into the chip, the chip designer may more aggressively use precharged dynamic logic without concern for the extreme process limits which may cause the circuit to fail.

The test circuits 102, may also be used to quantify the failure rate for a given aggressive design. A designer may determine that for a given device to be implemented on a chip, it is highly desirable to use a relatively long coupled length. While this coupled length may exceed the conservative design guidelines, by incorporating the test circuit 102 onto the chip, the susceptibility of such a design to failure can be quantified. For example, the designer may identify that 1–2% of chips designed with the aggressive coupled length will fail. Such a failure rate may be acceptable in view of other improvements, such as performance, resulting from the aggressive design. Moreover, because the test circuits 102 will be incorporated into each chip manufactured with the design, the designer can be confident that any chips which fail as a result of the more aggressive design specification can be rejected during a test phase of chip production.

Figure 2:
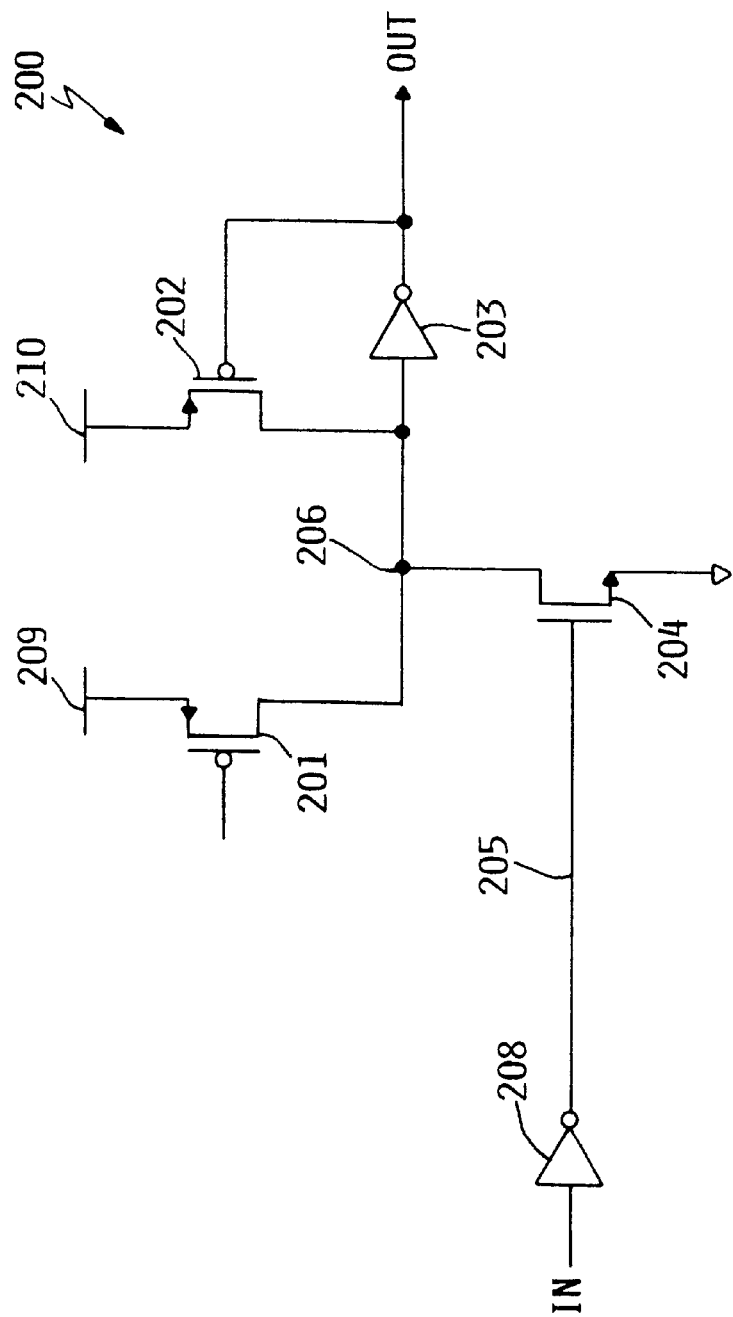
FIG. 2 illustrates a logic circuit used in accordance with an embodiment of the invention.

FIG. 2 illustrates an exemplary precharged dynamic logic circuit 200 representative of one type of functional circuit 103 provided in the logic partitions 101 (FIG. 1). In FIG. 2, a first P-type field effect transistor 201 is coupled between a voltage source 209 and a precharge node 206 to precharge the precharge node 206 to a first voltage value. A clock signal CLK is applied to the gate of transistor 201 to control its operation. A P-type pull-up transistor 202 is provided in a half latch circuit coupled between a voltage source 210 and the precharge node 206 to maintain the precharged voltage at the precharge node 206 after transistor 201 is turned off. An inverter 203 inverts the signal at the precharge node 206 to an output signal OUT. An N-type field effect transistor 204 is coupled between the precharge node 206 and ground. A control signal IN is applied to an inverter 208 which, in turn, is coupled via line 205 to the gate of transistor 204.

In operation, when the clock signal CLK goes low transistor 201 is turned on and the precharged node 206 is charged to a first voltage level. As the clock signal goes high, thereby shutting off transistor 201, the voltage level at node 206 is maintained by operation of the pull-up transistor 202. After the precharged node 206 has been precharged, the output signal OUT may be switched by lowering the control signal IN to raise the voltage applied to the gate of transistor 204 on line 205. As transistor 204 becomes conductive, the voltage level of the precharge node 206 drops below the inverting threshold of the inverter 203. Thus, the output signal OUT from inverter 203 goes high. The output signal OUT is also coupled to the gate of transistor 202 such that the transistor 202 is turned off as the output signal OUT goes high. As noted above, transistor 202 compensates for junction current leakage. To ensure proper operation of the precharged dynamic logic circuit to 200, transistor 202 must supply current the precharged node 206 sufficient to compensate for current leakage such as current which may leak through transistor 204, junction leakage, and the like.

The circuit must also be designed to prevent voltage variations on line 205, which tend make transistor 204 partially conductive, from causing the voltage level of the precharged node 206 from dropping below the inverting threshold of inverter 203. As noted above, such voltage variation may result from crosstalk originating from signal lines lying adjacent to line 205. As can be appreciated from FIG. 2, when the voltage level on line 205 turns on transistor 204 sufficient to allow enough current to leak from the precharged node 206 the output signal OUT may be undesirably switched, rendering the circuit unsuitable for use.

Figure 3:
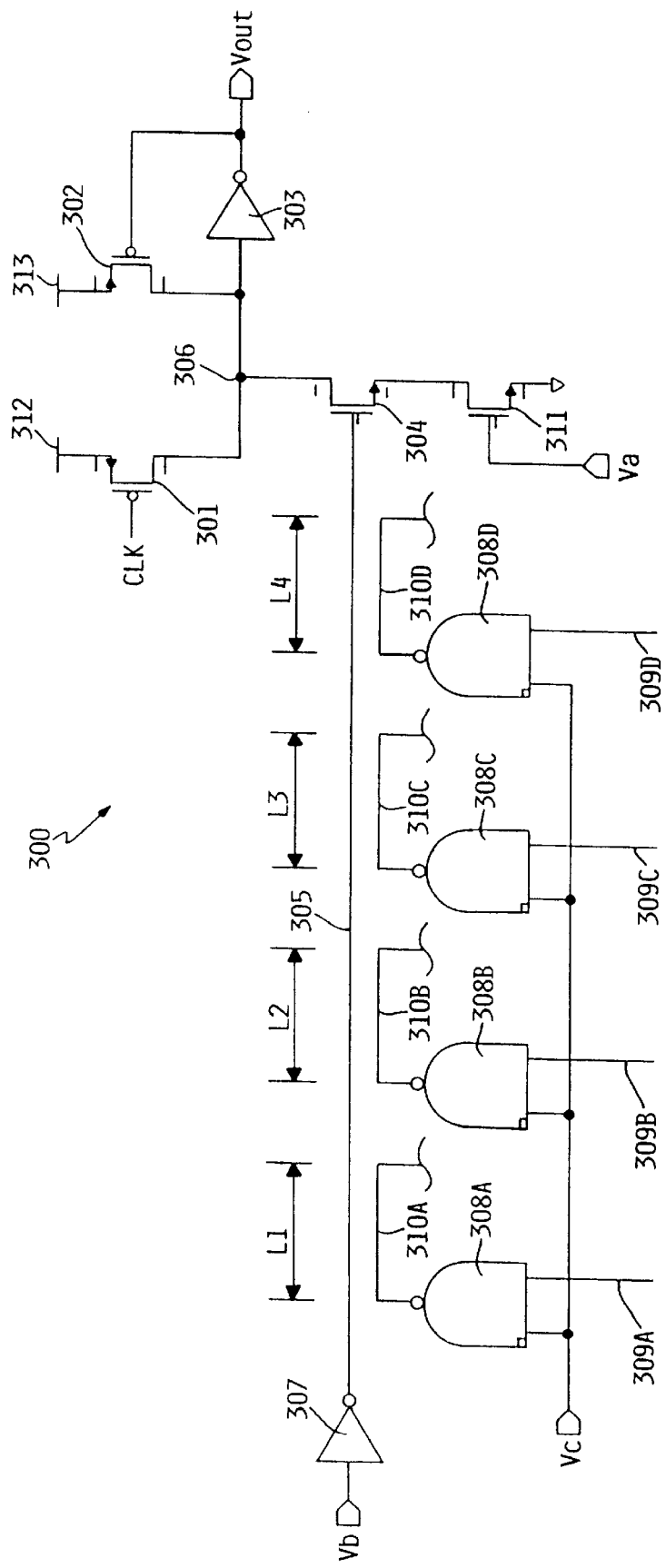
FIG. 3 illustrates a test circuit in accordance with an embodiment of the invention.

FIG. 3 illustrates an exemplary test circuit 300 to illustrate an embodiment of the invention. The illustrated test circuit 300 may be associated with functional circuitry having a dynamic logic circuit similar to that illustrated in FIG. 2. In FIG. 3, a P-type transistor 301 is coupled between a voltage source 312 and a precharge node 306. The gate of transistor 301 is coupled to a clock signal CLK. A second P-type transistor 302 is coupled between a voltage source 313 and the precharge node 306. Transistor 302 functions as a half latch pull-up transistor in a manner similar to that described in connection with FIG. 2. An inverter 303 is coupled between the precharge node 306 and a output signal $V_{out}$. The output signal $V_{out}$ is also coupled to the gate of transistor 302 to turn off the transistor 302 when the output signal is high.

A pair of N-type transistors 304 and 311 are coupled in series between the precharge node 306 and ground. A gate of transistor 304 is coupled via line 305 to the output of a weak inverter 307. A voltage level $V_b$ is applied to the input of the inverter 307. The gate of the second transistor 311 is coupled to a voltage signal $V_a$.

Test circuit 300 also includes a number of selectively actuated NAND gates 308A through 308D. A first input of each NAND gate 308A through 308D are commonly coupled to a voltage source $V_c$. Respective control signals 309A through 309D are provided to the second input of the NAND gates 308A through 308D. The output of the respective NAND gates 308A through 308D are provided to coupled lines 310A through 310D. The coupled lines 310A through 310D are formed on the chip at a location adjacent to one or both sides of line 305. As described more fully below, the coupled lines 310A through 310D are used to produce signals representative of signals used by adjacent circuitry in functional dynamic logic circuits. In this manner, the coupled lines 310A through 310D simulate the type of influences a functional dynamic logic circuit would be subjected to under an aggressive design.

In FIG. 3, the pull-up transistor 302 in the half latch is formed with a minimum size specified by design specifications for functional circuitry corresponding to the test circuit 300. Thus, the ability of the half latch to maintain the voltage value at the precharge node 306 is minimized by selection of components meeting the minimum design characteristics of the design specification. This ensures that the test circuit 300 tests an operation representative of the most sensitive device on the chip.

Inverter 307 is sufficiently weak enough to provide the maximum likelihood that coupled noise will reset the output $V_{out}$. The voltage source $V_b$ provided to inverter 307 may be provided from a scannable latch, or from a chip primary input. As noted above, the coupled lines 310A through 310D are selectively driven as the output of NAND gates 308A through 308D. In this manner, the total amount of coupled length relative to line 305 may be selectively determined by setting the control signals 309A through 309D. The control signals 309A through 309D will be selected such that the effective coupled length equals the maximum acceptable coupled length in the design specification. In operation, when the value of $V_c$ goes high a signal will be driven on the selected coupled lines 310A through 310D on the basis of the control signals 309A through 309D.

As noted above, a number of NAND gates are provided in order to enhance the flexibility of the test circuit 300 since the amount of coupled length used to test the circuit can be varied. As will be better appreciated from the description provided below, additional flexibility may be added to the test circuit 300. For example, the width of transistor 302 may be effectively varied by providing a number of stacked P-type transistors parallel to transistor 302. One gate in each stack may be used to control which stack will be used in the test. In this manner, a generic test circuit layout can be used to test susceptibility of different designs to failure. The generic structure may be extended even further by having selectively activatable stacks of N-type transistors in a parallel to transistors 304 and 311, to provide for different device characteristics.

The test circuit 300 depicted in FIG. 3 provides two different test modes. The first mode tests the influence that a selected capacitively coupled length has on the output signal $V_{out}$. In the first test mode, transistor 311 is turned on to provide an effective path from transistor 304 to ground. This is done by raising the voltage input $V_a$ to a level sufficient to completely turn on transistor 311. With transistor 311 turned on, the voltage value of $V_b$ is raised high causing inverter 307 to produce a low voltage signal on line 305 turning off transistor 304. Next, as the clock signal CLK transitions low, transistor 301 turns on and precharges node 306.

The state of NAND gates 308A through 308D are selected according to the values of control signals 309A through 309D, to select an effective coupled length to be tested. This will generally correspond to the maximum capacitive coupling length specified in the design specifications. With the control signals 309A through 309D selected, the voltage value $V_c$ is raised to a high state to produce a signal on selected coupled lines 310A through 310D. As a result, voltage is capacitively coupled from the selected signal lines 310A through 310D to line 305. If the capacitively coupled voltage is too high, transistor 304 may become sufficiently conductive to cause the output signal $V_{out}$ to switch.

By way of example, consider a chip where transistor 304 exhibits a threshold of approximately 200 millivolts (mV). If the capacitive coupling raises the voltage on line 305 to approximately 0.5 volts (V), an effective gate to source voltage of 0.5 V is provided on a device having a threshold of a 200 mV. As a result, transistor 304 is turned partially on such that the voltage at the precharge node 306 drops below the threshold of the inverter 303 and switches the output $V_{out}$. By monitoring for a switch in the output voltage $V_{out}$, it can be determined that a dynamic logic circuit exhibiting the minimal design characteristics will likely fail on this chip. Accordingly, the chip will be rejected on the basis of the above described test.

The second test mode tests the chip for susceptibility of external influences such as long-term DC voltages or long-term noise that may be coupled to the voltage applied to the gate of transistor 311. For example, a DC offset from another part of the chip may be seen by a transistor used in the functional circuitry.

In the second test mode $V_b$ is lowered in order to raise the voltage applied to the gate of transistor 304 via line 305. This effectively couples transistor 311 to the precharged node 306. In order to precharge node 306, the voltage signal $V_a$ is brought low to make transistor 311 nonconductive. As the clock signal CLK drops low, node 306 is then precharged. As described above, when node 306 is precharged, the output signal $V_{out}$ goes low turning on transistor 302. In this configuration, transistor 302 should operate to maintain the precharged voltage at node 306. Next the voltage signal $V_a$ is raised to allow an amount of current specified as acceptable in the design specification to conduct from the precharge node 306 to ground through transistors 304 and 311. If the pull-up transistor 302 is operating sufficiently, it should operate to compensate for the current leakage through transistor 311.

In the manner described above, the test circuit 300 tests whether a functional circuit aggressively designed to limits of the design specification will fail as a result of manufacturing process induced deviations. For example, an aggressive design may specify that with the minimum sized pull-up transistor 302, the design should be able to accommodate 300 mV of across-chip noise. Accordingly, in the design, the ratios of transistor 302 to transistors 304 and 311 are designed to survive a 300 mv across-chip noise. In the test, the voltage signal $V_a$ is raised to 300 mV and the output signal $V_{out}$ is observed to determine whether the raised voltage induces the circuit to switch. If the output signal $V_{out}$ changes, it can be determined that the tested chip is susceptible to failure as a result of a problem with a threshold associated with transistor 311 or a problem in the channel of transistor 302. In this manner, it can be determine whether a chip designed and manufactured using an aggressive design specification is susceptible to failure due to process limitations.

While the invention has been described above in connection with various embodiments, it is noted that the principles thereof may be implemented in other types of chip designs for a variety of different types of functional circuits. It will be apparent from the above disclosure that the implementation may be used with various other types of circuits which are susceptible to external influences. Thus, the various embodiments described above are provided by way of illustration only and should not be construed to limit the invention. Other schemes for allowing aggressive design of highly integrated circuits will be readily apparent upon review of the above disclosure. Those skilled in the art will readily recognize various modifications and changes which may be made to the present invention without strictly following the exemplary embodiments and applications illustrated and described herein, and without departing from the true spirit and scope of the present invention which is set forth in the following claims.

What is claimed is:

1. A method of testing susceptibility to failure of functional circuitry in a chip manufactured in accordance with design specifications for the chip, the method comprising the steps of:

providing on the chip a test functional circuit designed to exhibit minimally acceptable characteristics in view of the design specifications, a function of the test functional circuit corresponding to a function of the functional circuitry;

simulating operational influences representative of influences expected to be experienced by the functional circuitry during normal operation of the chip in view of the design specifications;

observing the function of the test functional circuit while simulating the operational influences; and determining that the chip is likely to fail when the function of the test functional circuit is adversely affected by the simulated operational influences.

2. A method as recited in claim 1, wherein the step of simulating operational influences comprises the steps of:

coupling a transistor between the test functional circuit and ground; and providing a first voltage value on a gate of the transistor to make the transistor partially conductive.

3. method as recited in claim 2, wherein the functional circuit includes a precharge node, the transistor being coupled between the precharged node and ground.

4. A method as recited in claim 1, wherein the step of simulating operational influences comprises the steps of:

providing a selectively actuatable signal on a first signal line located adjacent to a second signal line used to perform the function of the test functional circuit;

activating the selectively actuatable signal to capacitively couple a voltage from the first signal line to the second signal line.

5. A method as recited in claim 4, wherein the functional circuit includes a precharge node and the second signal line is connected to a transistor coupled between the precharge node and ground.

6. A method of testing susceptibility to failure of functional circuitry embodied in an integrated circuit (IC) manufactured in accordance with design specifications for the IC, the method comprising the steps of:

provM
providing in the IC a test circuit designed to exhibit minimally acceptable characteristics in view of the design specifications, a function of the test circuit corresponding to a function of the functional circuitry;

simulating operational influences representative of influences expected to adversely affect normal operation of the functional circuitry in view of the design specifications; and detecting when the function of the test functional circuit is adversely affected by the simulated operational influences.

7. The method recited in claim 6, wherein the step of simulating operational influences comprises the step of simulating a capacitively coupled voltage representative of a capacitively coupled voltage expected to adversely affect normal operation of the functional circuitry.

8. The method recited in claim 7, comprising the further step of quantifying the capacitively coupled voltage.

9. The method recited in claim 8, wherein:

the functional circuitry embodied in the IC comprises a dynamic logic circuit;

the function of the test circuit corresponds to a function of the dynamic logic circuit; and the step of simulating operational influences comprises the step of simulating a capacitively coupled voltage representative of a capacitively coupled voltage expected to adversely affect normal operation of the dynamic logic circuit.

10. The method recited in claim 6, wherein:

the functional circuitry embodied in the IC comprises a precharged dynamic logic circuit;

the function of the test circuit corresponds to a function of the precharged dynamic logic circuit; and the step of simulating operational influences comprises the step of simulating a capacitively coupled voltage representative of a capacitively coupled voltage expected to adversely affect normal operation of the precharged dynamic logic circuit.

11. The method recited in claim 6, wherein the step of simulating operational influences comprises the step of simulating line noise representative of line noise expected to adversely affect normal operation of the functional circuitry.

12. The method recited in claim 11, comprising the further step of quantifying the line noise.

13. The method recited in claim 6, wherein:

the functional circuitry embodied in the IC comprises a dynamic logic circuit;

the function of the test circuit corresponds to a function of the dynamic logic circuit; and the step of simulating operational influences comprises the step of simulating line noise representative of line noise expected to adversely affect normal operation of the dynamic logic circuit.

14. The method recited in claim 6, wherein:

the functional circuitry embodied in the IC comprises a precharged dynamic logic circuit;

the function of the test circuit corresponds to a function of the precharged dynamic logic circuit; and the step of simulating operational influences comprises the step of simulating line noise representative of line noise expected to adversely affect normal operation of the precharged dynamic logic circuit.

15. The method recited in claim 6, wherein the step of simulating operational influences comprises the step of simulating crosstalk representative of crosstalk expected to adversely affect normal operation of the functional circuitry.

16. The method recited in claim 15, comprising the further step of quantifying the crosstalk.

17. The method recited in claim 6, wherein:

the functional circuitry embodied in the IC comprises a dynamic logic circuit;

the function of the test circuit corresponds to a function of the dynamic logic circuit; and the step of simulating operational influences comprises the step of simulating crosstalk representative of crosstalk expected to adversely affect normal operation of the dynamic logic circuit.

18. The method recited in claim 6, wherein:

the functional circuitry embodied in the IC comprises a precharged dynamic logic circuit;

the function of the test circuit corresponds to a function of the precharged dynamic logic circuit; and the step of simulating operational influences comprises the step of simulating crosstalk representative of crosstalk expected to adversely affect normal operation of the precharged dynamic logic circuit.

19. The method recited in claim 6, wherein the step of providing the test circuit comprises the further step of providing the test circuit which exhibits process related deviations from the design specifications equivalent to process related deviations exhibited by the functional circuitry.

20. The method recited in claim 6, comprising the further step of rejecting an IC provided with a test circuit in response to detecting the function of the test circuit being adversely affected by the simulated operational influences.

* * * * *